US011527637B2

(12) United States Patent
Zhang et al.

(10) Patent No.: US 11,527,637 B2
(45) Date of Patent: Dec. 13, 2022

(54) ION IMPLANTATION TO CONTROL FORMATION OF MOSFET TRENCH-BOTTOM OXIDE

(71) Applicant: Applied Materials, Inc., Santa Clara, CA (US)

(72) Inventors: Qintao Zhang, Mt Kisco, NY (US); Samphy Hong, Saratoga Springs, NY (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 17/188,051

(22) Filed: Mar. 1, 2021

(65) Prior Publication Data

US 2022/0278221 A1 Sep. 1, 2022

(51) Int. Cl.
*H01L 29/66* (2006.01)
*H01L 29/06* (2006.01)
*H01L 29/778* (2006.01)

(52) U.S. Cl.
CPC ...... *H01L 29/6659* (2013.01); *H01L 29/0653* (2013.01); *H01L 29/7788* (2013.01)

(58) Field of Classification Search
CPC ............. H01L 29/6659; H01L 29/0653; H01L 29/7788
See application file for complete search history.

(56) References Cited

U.S. PATENT DOCUMENTS

| | | | |
|---|---|---|---|
| 2016/0322469 A1* | 11/2016 | Bhalla | H01L 29/4236 |
| 2021/0280598 A1* | 9/2021 | Nagashima | G03B 15/14 |
| 2021/0343834 A1* | 11/2021 | Lichtenwalner | H01L 29/7813 |

* cited by examiner

*Primary Examiner* — Wasiul Haider
(74) *Attorney, Agent, or Firm* — KDB Firm PLLC

(57) ABSTRACT

Disclosed herein are methods for forming MOSFETs. In some embodiments, a method may include providing a device structure including a plurality of trenches, forming an oxide layer over the device structure including within each of the plurality of trenches and over a top surface of the device structure, and implanting a first portion of the oxide layer using an ion implant delivered to the device structure at a non-zero angle of inclination relative to a perpendicular extending from a top surface of the device structure. The method may further include removing the oxide layer from the top surface of the device structure and from a sidewall of each of the plurality of trenches, wherein a second portion of the oxide layer remains along a bottom of each of the plurality of trenches.

20 Claims, 7 Drawing Sheets

ION IMPLANTATION TO CONTROL FORMATION OF MOSFET TRENCH-BOTTOM OXIDE

FIELD OF THE DISCLOSURE

The present embodiments relate to semiconductor device patterning, and more particularly, to MOSFETs with increased trench-bottom oxide thickness.

BACKGROUND OF THE DISCLOSURE

Power metal-oxide-semiconductor field-effect transistors (MOSFETs) are often used in load switching applications where reduction of the on-resistance ($R_{ds}$) of the device is desirable. In some applications, the $R_{ds}A$ of the device is minimized, where $R_{ds}A$ is the on-resistance of the device multiplied by the active area of the device. Additionally, power MOSFETs are commonly used in high frequency DC-DC applications.

Trench-based MOSFETs are often used to reduce $R_{dsA}$ of the device. However, conventional thermal oxidation processes lead to non-uniform oxide in the trench. In some cases, a reduction in trench width causes trench-bottom oxide thinning due to oxygen diffusion or due to crystal orientation (e.g., for SiC trenches), resulting in degraded breakdown voltage. Furthermore, trench MOSFET scaling also requires a thicker bottom oxide to reduce gate charge (Qg). Accordingly, improved trench oxide formation approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a plurality of trenches, forming an oxide layer over the device structure including within each of the plurality of trenches and over a top surface of the device structure, and implanting a first portion of the oxide layer using an ion implant delivered to the device structure at a non-zero angle of inclination relative to a perpendicular extending from a top surface of the device structure. The method may further include removing the oxide layer from the top surface of the device structure and from a sidewall of each of the plurality of trenches, wherein a second portion of the oxide layer remains along a bottom of each of the plurality of trenches.

In another aspect, a method of forming a MOSFET may include providing a device structure including a plurality of trenches, forming an oxide layer over the device structure including within each of the plurality of trenches and over a top surface of the device structure, and implanting just a first portion of the oxide layer using an ion implant delivered to the device structure at a non-zero angle of inclination relative to a perpendicular extending from a top surface of the device structure. The method may further include removing the oxide layer from the top surface of the device structure and from a sidewall of each of the plurality of trenches, wherein a second portion of the oxide layer remains along a bottom of each of the plurality of trenches.

In yet another aspect, a method of forming a semiconductor device may include providing a device structure including a plurality of trenches and forming an oxide layer over the device structure including within each of the plurality of trenches and over a top surface of the device structure, wherein a thickness of the oxide layer along the top surface of the device structure is greater than a thickness of the oxide layer along the sidewall of each of the plurality of trenches. The method may further include implanting just a first portion of the oxide layer using an ion implant delivered to the device structure at a non-zero angle of inclination relative to a perpendicular extending from a top surface of the device structure, and removing the oxide layer from the top surface of the device structure and from a sidewall of each of the plurality of trenches, wherein a second portion of the oxide layer remains along a bottom of each of the plurality of trenches.

BRIEF DESCRIPTION OF THE DRAWINGS

The accompanying drawings illustrate exemplary approaches of the disclosure, including the practical application of the principles thereof, as follows.

Figure 1:
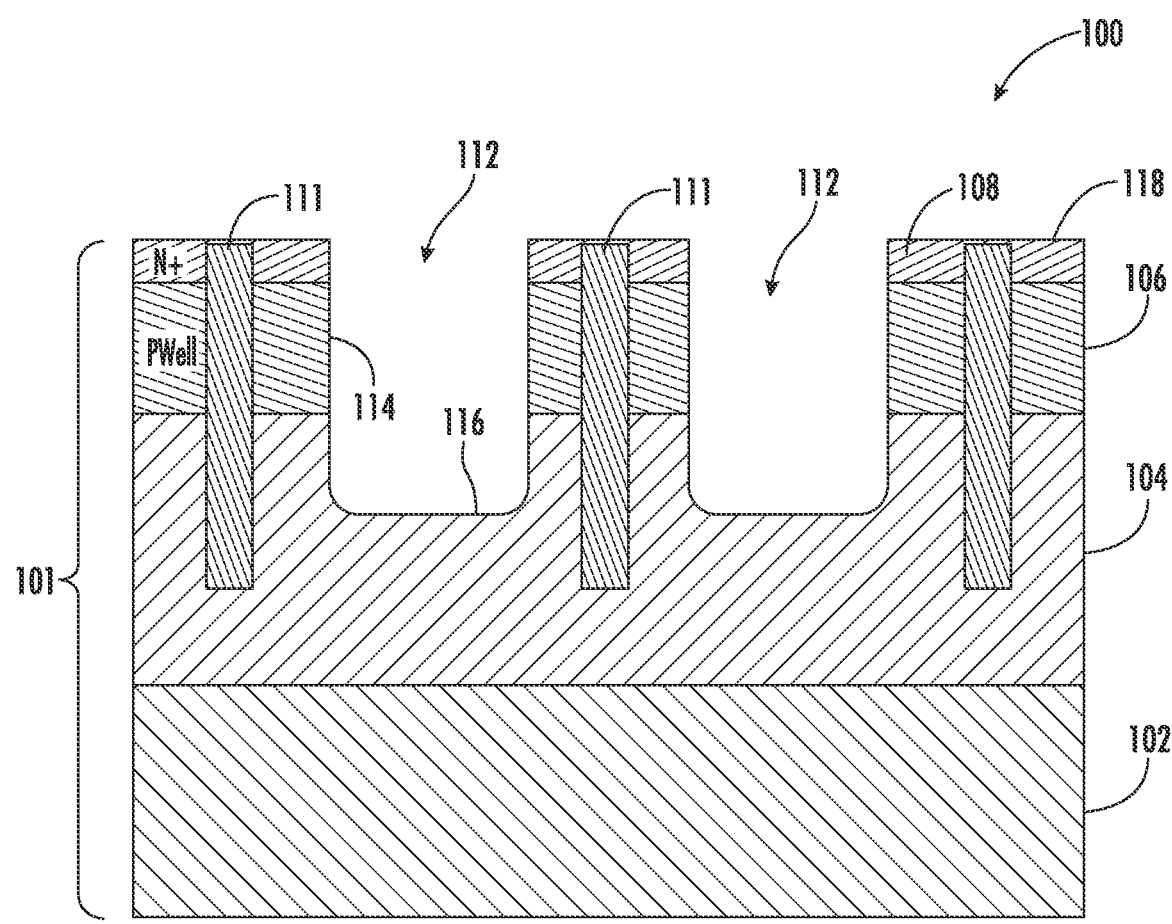
FIG. 1 is a cross-sectional side view of a device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously provide a bottom-trench oxide formation process for MOSFET devices. In some embodiments, a bottom-up filled dielectric layer, such as high-density plasma (HDP) oxide layer, is formed over a device structure, and an angled ion implantation is performed to the oxide layer along a top surface of the device structure to increase an etch rate of the oxide layer during a subsequent removal process (e.g., wet etch). The ion implantation advantageously enables a precisely-controlled, thick bottom oxide to maintain a constant cell structure and maximize scalability.

FIG. 1 is a side cross-sectional view of a semiconductor device structure (hereinafter "device") 100, such as a MOSFET, according to one or more embodiments described herein. The device 100 may include a device structure 101 having a substrate 102, an epitaxial layer 104, a well 106, and a source region or layer 108. The device structure 101 may further include a shielding layer 111 (e.g., a P− shielding layer) through the well 104 and a portion of the epitaxial layer 104. As shown, the shielding layer 111 is positioned between each of a plurality of trenches 112 formed through the device structure 101. Although non-limiting, the epitaxial layer 104 may be a silicon carbide (SiC) n-type drift layer, the well 106 may be a p-type well, and the source layer 108 may be an $N^+$ source layer. In other embodiments, the source layer 108 may include N+ and P+ regions next to each other, wherein P+ serves as a PWell contact and N+ serves as the source layer 108. Shown as a single layer, the epitaxial layer 104 may include multiple layers in other embodiments. In some embodiments, the well 106 may be formed using a plurality of doping steps or epitaxy steps.

The plurality of trenches 112 may be formed in the device 100, e.g., using one or more blocking and vertical etch processes to reach the sidewall slope between 80 to 90 degrees relative to a top surface 118 of the device structure 101. The trenches 112 may be defined, in part, by a sidewall 114 and a bottom surface 116. The sidewall 114 may include portions of the epitaxial layer 104, the well 106, and the source layer 108. As demonstrated, the trenches 112 may be formed after the well 106 and source layer 108 are formed.

Figure 2:
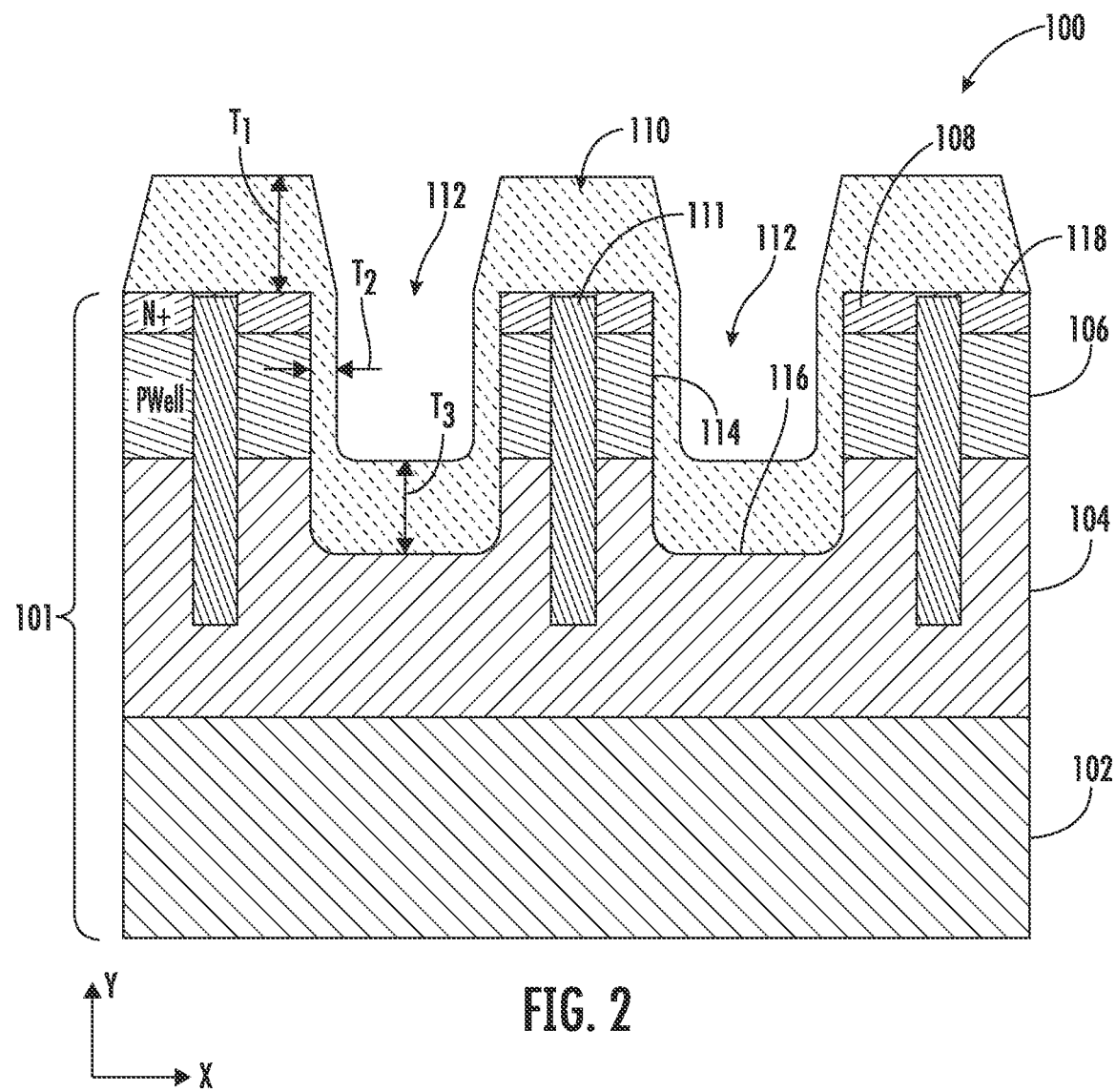
FIG. 2 is a side cross-sectional view illustrating the device following formation of an oxide layer, according to embodiments of the present disclosure.

As shown in FIG. 2, an oxide layer (e.g., a high-density plasma oxide) 110 may then be formed over the device structure 101, including within each of the trenches 112. In some embodiments, the oxide layer 110 may be a non-uniform layer of silicon oxide ($SiO_2$) or other oxide layer(s) formed using a conformal deposition process. As shown, the oxide layer 110 may be formed along the sidewall 114 and the bottom surface 116 of each trench 112. The oxide layer 110 may also be formed along the top surface 118 of the device structure 101. In exemplary embodiments, the oxide layer 110 atop the device structure 101 has a first thickness 'T1' (e.g., in the y-direction), while the oxide layer 110 along the sidewall 114 has a second thickness 'T2' (e.g., in the x-direction) and the oxide layer 110 along the bottom surface 116 has a third thickness 'T3' (e.g., in the y-direction), wherein T1>T2 and T3.

Figure 3:
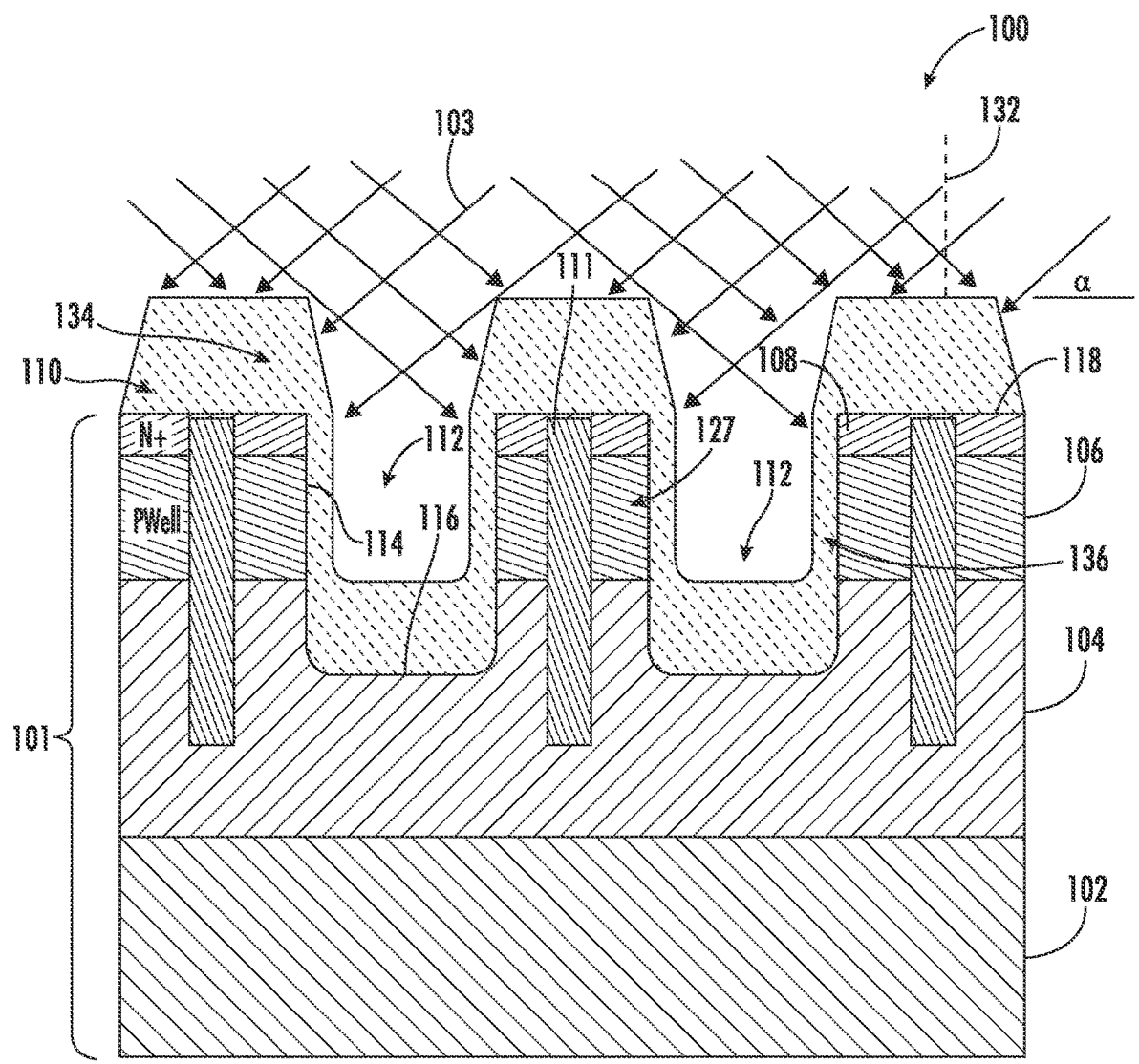
FIG. 3 is a side cross-sectional view illustrating the device during an angled ion implant, according to embodiments of the present disclosure.

FIG. 3 demonstrates an ion implant 130 performed to the device 100. More specifically, the ion implant 130 may be an angled ion implant directed to the oxide layer 110 at a non-zero angle of inclination (α) relative to a perpendicular 132 extending from the top surface 118 of the device structure 101. By selecting an appropriate angle of inclination, the ion implant 130 may impact just a first portion 134 of the oxide layer 110 without causing damage to a channel 127 of the device structure 101. More specifically, the ion implant 130 may impact the oxide layer 110 located along the top surface 118 of the device structure 101 (and optionally along the source layer 108), without impacting a lower, second portion 136 of the oxide layer 110. As shown, the second portion 136 of the oxide layer 110 may extend along the well 106 and along the bottom surface 116 of the trenches 112. The angle of inclination α may vary in other embodiments so the ion implant 130 impacts more or less of the oxide layer 110.

In some embodiments, ions (e.g., argon, Ge, Phos, Boron, As, Carbon, N, F, Si, Kr) of the ion implant 130 may modify surface properties of the first portion 134 of the oxide layer 110. For example, the ion implant 130 may increase an etch rate of the oxide layer 110 during a subsequent etch process such that the first portion 134 of the oxide layer 110 is removed at a faster rate relative to the second portion 136. Although non-limiting, the etch rate for the first portion 134 of the oxide layer 110 can be up to 9× greater than for the second portion 136 when a wet-etch process is used. It will be appreciated that the degree to which the physical and/or chemical composition of the first portion 134 of the oxide layer 110 is modified may be determined by one or more variables, including, but not limited to, the species of ion selected, the material properties of the oxide layer 110 being modified, the rotational orientation of the device 100, the temperature at which the ions are implanted, the concentration and/or dosage of the ions being implanted, and the amount of energy with which the ions are implanted in the oxide layer 110. Furthermore, the device structure 101 may be rotated during or between successive implants so each sidewall 114 of the device structure 101 is impacted. For example, the device structure 101 may be rotated between each implant process by 45°, 90°, 180°, etc. Embodiments herein are not limited in this context.

Figure 4:
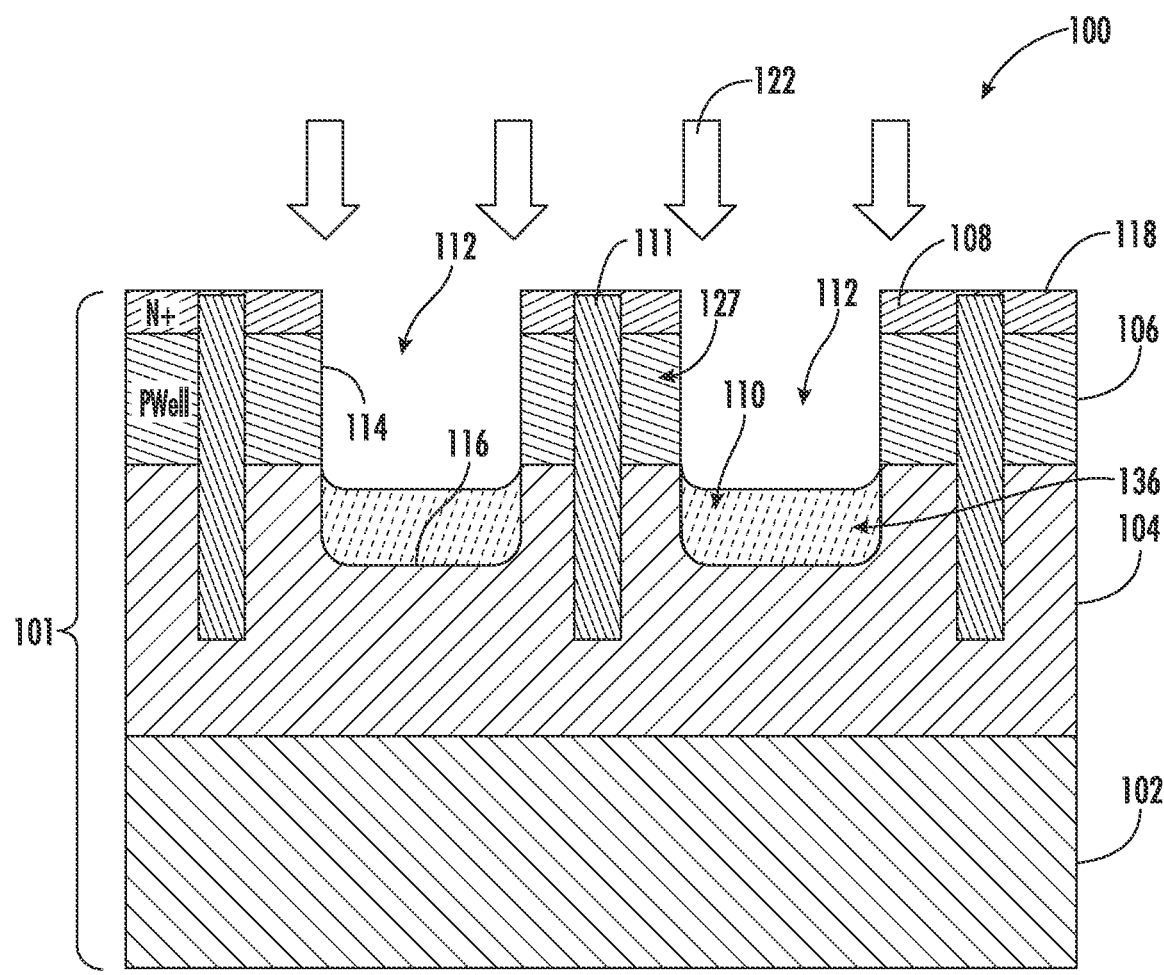
FIG. 4 is a side cross-sectional view illustrating the device following an etch process, according to embodiments of the present disclosure.

In FIG. 4, the oxide layer 110 may be partially removed from the device 100 using, e.g., a wet etch process 122. As shown, the oxide layer 110 may be removed from the top surface 118 of the device stack and from the sidewall 114 of each trench 112. More specifically, the oxide layer 110 is removed from along the source layer 108 and the well 106 within each of the trenches 112. Meanwhile, the oxide layer 110 remains along the bottom surface 116 of the trenches 112. As shown, the epitaxial layer 104 may remain covered by the oxide layer 110 within the trenches 112. In various embodiments, the etch process 122 may include a vertical and/or angled ion etch, or an isotropic wet etch. In the case of an isotropic wet etch, although T1 is thicker than both T2 and T3 (shown in FIG. 2), due to the prior ion implant 130, the oxide layer 110 is simultaneously removed from the top surface 118 and from the sidewall 114 without being completely removed from the bottom surface 116 of the trenches 112. By maintaining the oxide thickness along the bottom of the trenches 112, critical electrical field and gate charges may advantageously be reduced, while breakdown and off-power may be improved.

Figure 5:
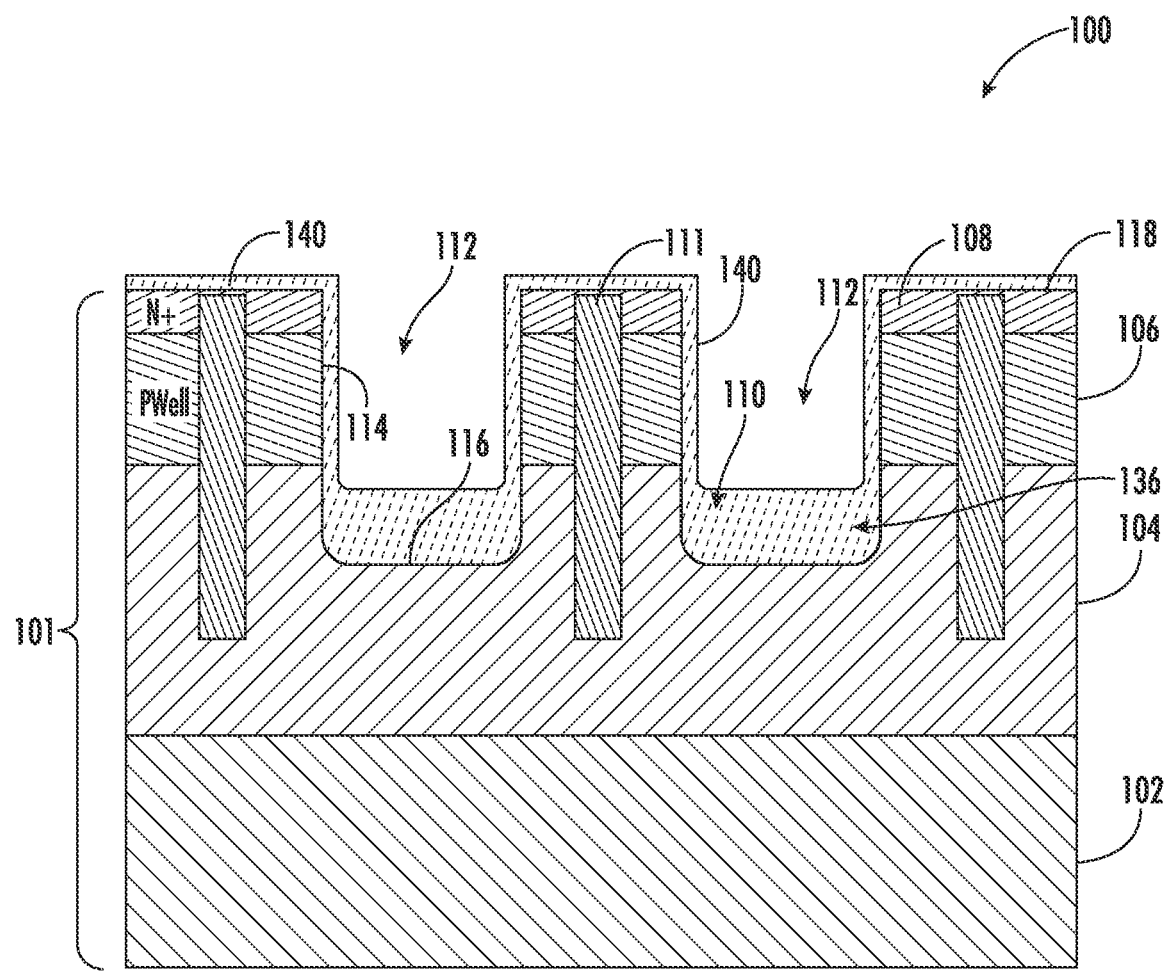
FIG. 5 is a side cross-sectional view illustrating formation of a gate oxide layer over the device, according to embodiments of the present disclosure.

FIG. 5 demonstrates formation of a gate oxide layer 140 over the device 100, including within the trenches 112, after the oxide layer 110 is removed from the top surface 118 of the device structure 101 and from the sidewall 114 of the trenches 112. As shown, the gate oxide layer 140 may be formed atop the remaining oxide layer 110 along the bottom surface 116 of the trenches 112. In some embodiments, the gate oxide layer 140 is formed by a thermal oxidation or a deposition process, such as CVD, to device 100.

Figure 6:
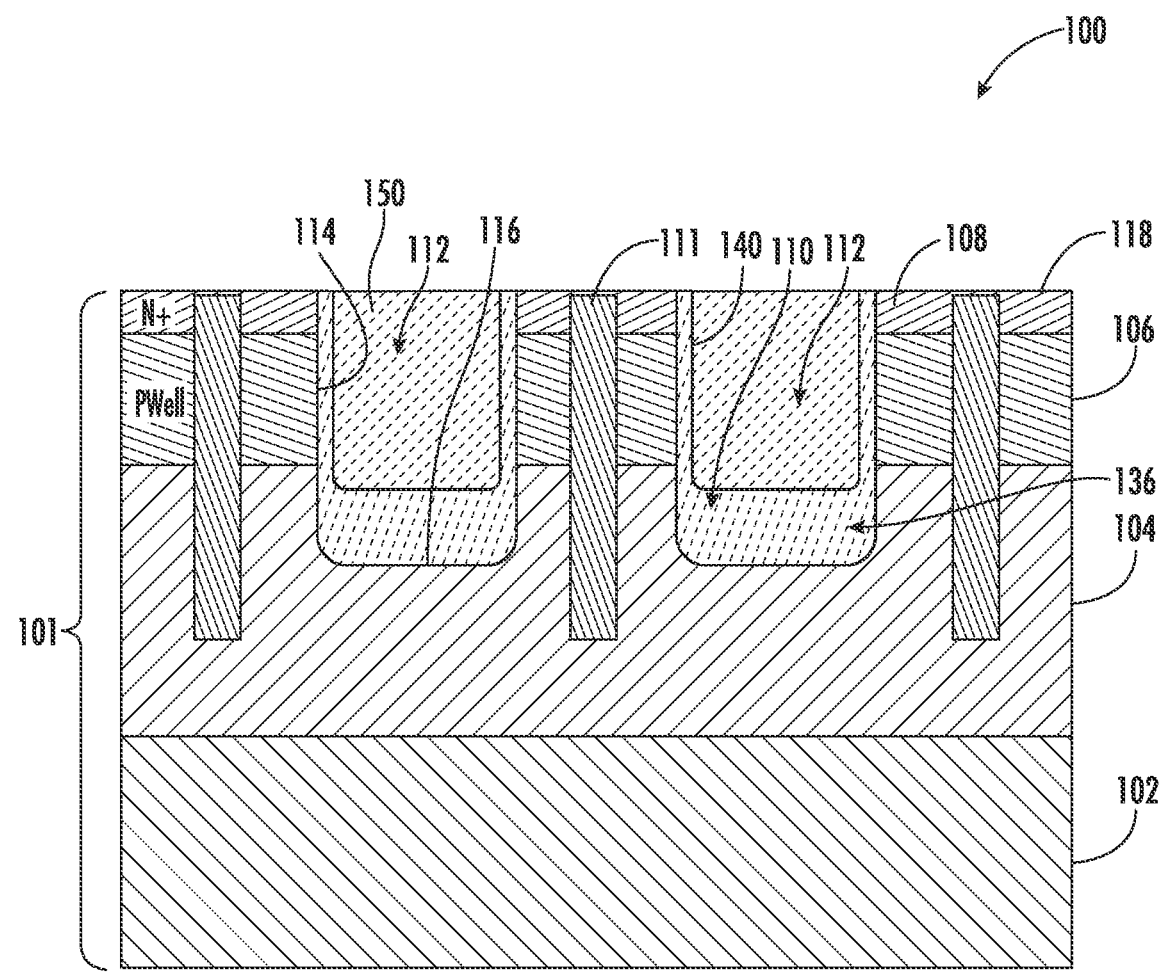
FIG. 6 is a side cross-sectional view illustrating formation of a gate material, according to embodiments of the present disclosure.

As demonstrated in FIG. 6, the trenches 112 may then be filled with a gate material 150. In some embodiments, the gate material 150 may be a polysilicon gate refill deposited over the device 100 and then planarized (e.g., via CMP) or etched back selective to the top surface 118 of the device structure 101. Although non-limiting, in various embodiments, the gate material 150 may be a p-type or n-type polysilicon, which is doped.

In some embodiments, a second gate material (not shown) may be formed over the gate material 150 to form a split gate, wherein the gate material is separated from the second gate material by an isolation layer. Although non-limiting, the gate material and the second gate material may be different materials, wherein the first gate material may be a p-type polysilicon, and the second gate material may be an active n-type polysilicon.

In sum, embodiments herein disclose a device and associated process flow for forming a MOSFET. Embodiments of the present disclosure provide at least the following technical advantages. Firstly, the implantation process described herein is capable of enabling precise trench bottom oxide formation using a bottom-up dielectric filling process, such as high-density plasma oxide or sub atmospheric CVD. Secondly, the ion implantation enhances the oxide etch rate to cause the oxide along the top of the device structure to be removed in the same step as the sidewall oxide.

Figure 7:
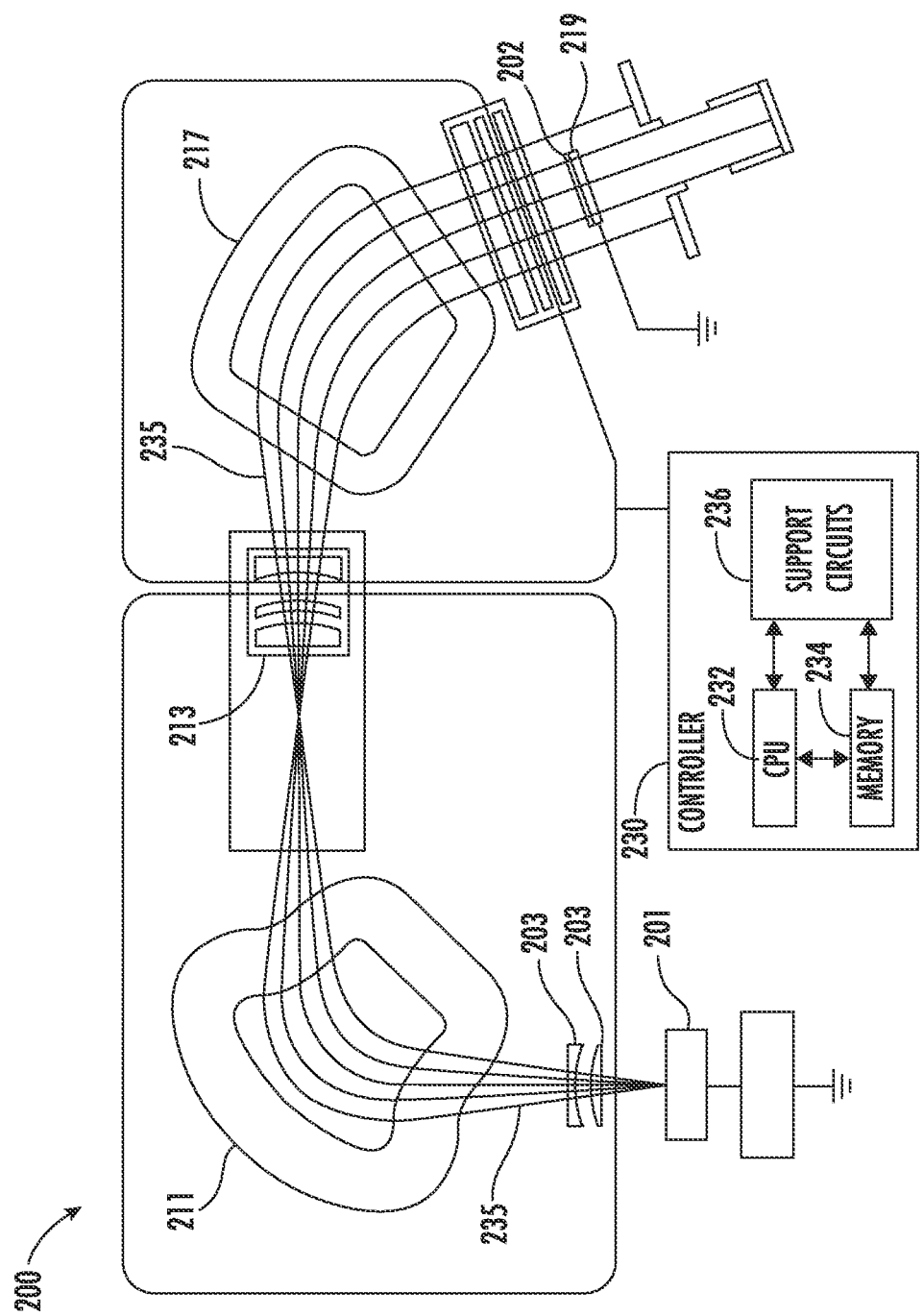
FIG. 7 illustrates a schematic diagram of a processing apparatus according to embodiments of the present disclosure.

FIG. 7 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the ion implant 130 demonstrated in FIG. 3. The ion source 201 may also provide an ion etch, such as the etch process 122 of FIG. 4. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program (s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device structure including a plurality of trenches, the device structure comprising:
   an epitaxial layer over a substrate;
   a well within the epitaxial layer; and
   a source region over the well;
   forming an oxide layer within each of the plurality of trenches and over a top surface of the device structure, wherein the oxide layer is formed after the source region is formed over the well;
   implanting a first portion of the oxide layer using an ion implant delivered to the device structure at a non-zero angle of inclination relative to a perpendicular extending from the top surface of the device structure; and
   removing the oxide layer from the top surface of the device structure and from a sidewall of each of the plurality of trenches, wherein a second portion of the oxide layer remains along a bottom of each of the plurality of trenches.

2. The method of claim 1, further comprising:
   forming a gate oxide layer within each of the plurality of trenches; and
   forming a gate material over the gate oxide layer within each of the plurality of trenches.

3. The method of claim 1,
   further comprising forming the plurality of trenches by etching the epitaxial layer, the well, and the source region.

4. The method of claim 1, wherein providing the device structure further comprises providing a shielding layer between each of the plurality of trenches.

5. The method of claim 1, wherein removing the oxide layer comprises performing a wet etch to the oxide layer.

6. The method of claim 1, wherein forming the oxide layer comprises depositing a high density plasma over the device structure, wherein a thickness of the oxide layer along the top surface of the device structure is greater than a thickness of the oxide layer along the sidewall of each of the plurality of trenches.

7. The method of claim 1, wherein the ion implant impacts the oxide layer along the top surface of the device structure without impacting the oxide layer along the well within each of the plurality of trenches.

8. The method of claim 1, wherein implanting the first portion of the oxide layer comprises modifying a composition of the first portion of the oxide layer to increase an etch rate of the first portion of the oxide layer relative to the second portion of the oxide layer.

9. A method of forming a MOSFET, comprising:
providing a device structure including a plurality of trenches, the device structure comprising:
an epitaxial layer over a substrate;
a well within the epitaxial layer; and
a source region over the well;
forming an oxide layer within each of the plurality of trenches and over a top surface of the device structure, wherein the oxide layer is formed after the source region is formed over the well;
implanting just a first portion of the oxide layer using an ion implant delivered to the device structure at a non-zero angle of inclination relative to a perpendicular extending from the top surface of the device structure; and
removing the oxide layer from the top surface of the device structure and from a sidewall of each of the plurality of trenches, wherein a second portion of the oxide layer remains along a bottom of each of the plurality of trenches.

10. The method of claim 9, further comprising:
forming a gate oxide layer within each of the plurality of trenches; and
forming a gate material over the gate oxide layer within each of the plurality of trenches.

11. The method of claim 9, wherein providing the device structure comprises:
providing a shielding layer through the well, wherein the shielding layer is positioned between each of the plurality of trenches and
wherein the plurality of trenches are formed by etching through the epitaxial layer, the well, and the source region.

12. The method of claim 9, wherein the ion implant impacts the oxide layer along the top surface of the device structure without impacting the oxide layer along the well within each of the plurality of trenches.

13. The method of claim 9, wherein removing the oxide layer comprises performing a wet etch to the oxide layer to simultaneously remove the oxide layer from the top surface of the device structure and from the sidewall of each of the plurality of trenches.

14. The method of claim 9, wherein forming the oxide layer comprises depositing a high density plasma over the device structure, wherein a thickness of the oxide layer along the top surface of the device structure is greater than a thickness of the oxide layer along the sidewall of each of the plurality of trenches.

15. The method of claim 9, wherein implanting the first portion of the oxide layer comprises modifying a composition of the first portion of the oxide layer to increase an etch rate of the first portion of the oxide layer relative to the second portion of the oxide layer.

16. A method of forming a semiconductor device, comprising:
providing a device structure including a plurality of trenches, the device structure comprising:
an epitaxial layer over a substrate;
a well within the epitaxial layer; and
a source region over the well;
forming an oxide layer within each of the plurality of trenches and over a top surface of the device structure, wherein a thickness of the oxide layer along the top surface of the device structure is greater than a thickness of the oxide layer along a sidewall of each of the plurality of trenches, and wherein the oxide layer is formed after the source region is formed over the well;
implanting just a first portion of the oxide layer using an ion implant delivered to the device structure at a non-zero angle of inclination relative to a perpendicular extending from the top surface of the device structure; and
removing the oxide layer from the top surface of the device structure and from a sidewall of each of the plurality of trenches, wherein a second portion of the oxide layer remains along a bottom of each of the plurality of trenches.

17. The method of claim 16, further comprising:
forming a gate oxide layer within each of the plurality of trenches; and
forming a gate material over the gate oxide layer within each of the plurality of trenches.

18. The method of claim 16, wherein providing the device structure comprises:
providing a shielding layer through the well, wherein the shielding layer is positioned between each of the plurality of trenches and
wherein the plurality of trenches are formed through the epitaxial layer, the well, and the source region.

19. The method of claim 16, wherein removing the oxide layer comprises performing a wet etch to the oxide layer to simultaneously remove the oxide layer from the top surface of the device structure and from the sidewall of each of the plurality of trenches.

20. The method of claim 16, wherein forming the oxide layer comprises depositing a high density plasma over the device structure.

* * * * *